United States Patent
Narula et al.

(10) Patent No.: US 8,063,685 B1
(45) Date of Patent: Nov. 22, 2011

(54) PULSED FLIP-FLOP CIRCUIT

(75) Inventors: Kapil Narula, Faridkot (IN); Amol Agarwal, Noida (IN); Sumeet Aggarwal, Delhi (IN); Sunit K. Bansal, Ghaziabad (IN); Sabaa Sandhu, Amritsar (IN); Harkaran Singh, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/852,514

(22) Filed: Aug. 8, 2010

(51) Int. Cl.
*H03K 3/00* (2006.01)

(52) U.S. Cl. .......................................... 327/201; 327/210

(58) Field of Classification Search .......................... None
See application file for complete search history.

(56) References Cited

U.S. PATENT DOCUMENTS

| | | | |
|---|---|---|---|
| 5,557,225 A | 9/1996 | Denham | |
| 6,064,246 A | 5/2000 | Endo | |
| 6,608,513 B2 | 8/2003 | Tschanz | |
| 6,753,715 B2 | 6/2004 | Oklobdzija | |
| 7,154,319 B2 | 12/2006 | Kim | |
| 7,180,350 B2 | 2/2007 | Hsieh | |
| 2007/0146032 A1* | 6/2007 | Sedlak | 327/218 |
| 2008/0116953 A1* | 5/2008 | Hirata et al. | 327/218 |
| 2010/0308864 A1* | 12/2010 | Lee et al. | 326/46 |

* cited by examiner

*Primary Examiner* — Lincoln Donovan
*Assistant Examiner* — Sibin Chen
(74) *Attorney, Agent, or Firm* — Charles Bergere

(57) ABSTRACT

A flip-flop circuit includes a data input, a clock input for receiving a clock signal having active edges and inactive edges, a data output, an input circuit, a pulse generator, and a latch. The input circuit sets first and second nodes to different initial logic states in response to an inactive edge of the clock signal, and selectively changes the logic state of either the first node or the second node in response to a pulse input signal to control the state of a third node, such that the selection depends on the logic state of the data input. The pulse generator circuit enables the pulse input signal in response to an active edge of the clock signal, and disables the pulse input signal in response to detecting the change in the initial logic state of either the first node or the second node. The latch stores a data output signal for output at the data output, the data output signal depending on the logic state of the third node.

6 Claims, 8 Drawing Sheets

PULSED FLIP-FLOP CIRCUIT

BACKGROUND TO THE INVENTION

The present invention relates to flip-flop circuits, and in particular to flip-flop circuits having low set up and hold time characteristics.

Flip-flop circuits are widely used in digital electronic circuits. Examples of conventional flip-flop circuit configurations include D-type, JK-type, and master-slave type devices.

FIG. 1(a) shows the logic diagram of a master-slave type flip-flop 100 comprising a master latch 102 and a slave latch 104. Master latch 102 receives a data input signal DATA_IN on a data input terminal. Slave latch 104 includes a data input coupled to a data output Q1 of master latch 102 and receives a clock input signal CLK1' which is the complement of clock signal CLK1.

FIG. 1(b) shows the timing diagram of the master-slave type flip-flop 100. On the active edge 110 of clock input signal CLK1, which in this example is a rising edge, the master latch 102 transmits the data input signal DATA_IN to data output terminal Q1 after a time delay representing the propagation delay of the master latch 102. Slave latch 104 ignores changes to data output Q1 until the falling edge 112 of the clock input signal CLK1, which corresponds with the rising edge of inverted clock signal CLK1'.

On the falling edge of the clock input signal CLK1, the data output at data output terminal Q1 is transmitted to output terminal Q as DATA_OUT after a time delay representing the propagation delay of the slave latch 104. The master latch 102 thus latches the data input signal DATA_IN when the clock signal CLK1 is in a first state and the slave latch 104 latches the data output signal from the master latch 102 when the clock signal CLK1 is in a second state.

For a master slave flip-flop 100 to function predictably, data input signal DATA_IN must satisfy two timing constraints, namely, a setup time and a hold time, relative to active edges of clock input signal CLK1. The setup time is the minimum time that data input signal DATA_IN must be held valid prior to an active clock edge. The hold time is the minimum time that data input signal DATA_IN must be held valid after an active clock edge. If either the setup time or hold time requirement is not satisfied, the data output signal DATA_OUT of master-slave type flip-flop 100 is undeterminable and may result in a metastable condition.

Flip-flops circuits with long setup and hold time requirements thus present an obstacle to increasing clock frequency, and therefore to improving the performance of digital circuits. Hence, it is becoming increasingly important to implement flip-flop circuits having relatively low setup and hold time requirements.

Higher speed flip-flops have been created by employing pulse-triggered flip-flops which incorporate pulse-generating circuits for converting a clock signal into a pulse signal having a width less than that of the clock signal. Pulse-triggered circuits may be implemented using a single latch and thus require less area, and lower power requirements as compared to conventional master-slave flip-flops.

FIG. 2(a) shows the logic diagram of a pulse-triggered flip-flop 200 having a data input terminal D1 for receiving data input signal DATA_IN, a clock input terminal, and a data output terminal Q1. Pulse-generation circuit 202 includes a series arrangement 204 of inverters and XNOR gate 206. Clock input signal CLK1 is passed to the input 'A' of XNOR gate 206 and included in a logical XNOR operation with the delayed and inverted data signal at input 'B' of XNOR gate 206.

FIG. 2(b) shows the timing diagram of pulse-generation circuit 202. The output at XNOR gate 206 provides a clock input to register 208 as a pulse signal (PULSE) having a pulse width (W) that depends on the total propagation delay ($T_{pd}$) introduced by the inverter arrangement 204.

The total propagation delay ($T_{pd}$) provided by the inverter arrangement 204, and thus the width (W) of the pulse signal, depends on the propagation delay of each inverter in the inverter arrangement 204, which in turn is susceptible to process-voltage-temperature (PVT) variations. These PVT related variations lead to stringent setup and hold time requirements which place constraints on the data input signal. The constraints depend on a "worst" case PVT variation and a "best" case PVT variation. For example, for the "worst" case PVT variation, meaning the PVT case where the propagation delay ($T_{pd}$) is highest and thus the pulse width (W) is wider, data input signal DATA_IN is required to be held constant for a longer duration. On the other hand, for the "best" case PVT variation, where the propagation delay ($T_{pd}$) is lowest and thus the pulse width (W) is narrower, the slew rate of data signal DATA_IN is required to be higher. If either of these conditions are not satisfied, a race condition will occur.

A need exists for a flip-flop circuit that avoids the set up time requirement and provides a reduced hold time requirement.

BRIEF DESCRIPTION OF THE DRAWINGS

A preferred embodiment of the present invention will now be described with reference to the accompanying drawings wherein.

DESCRIPTION OF PREFERRED EMBODIMENT

Figure 1A:
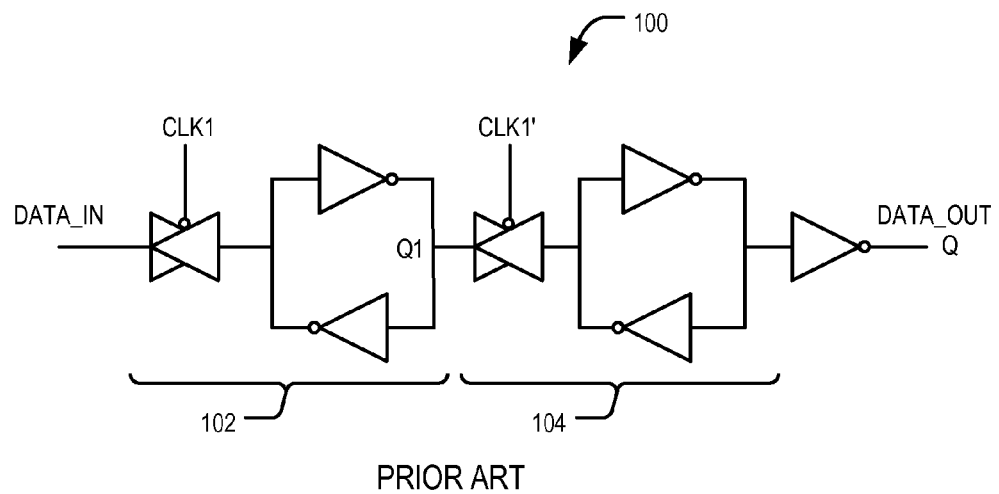
FIG. 1(a) shows a logic diagram of a conventional master slave flip-flop circuit.
Figure 1B:
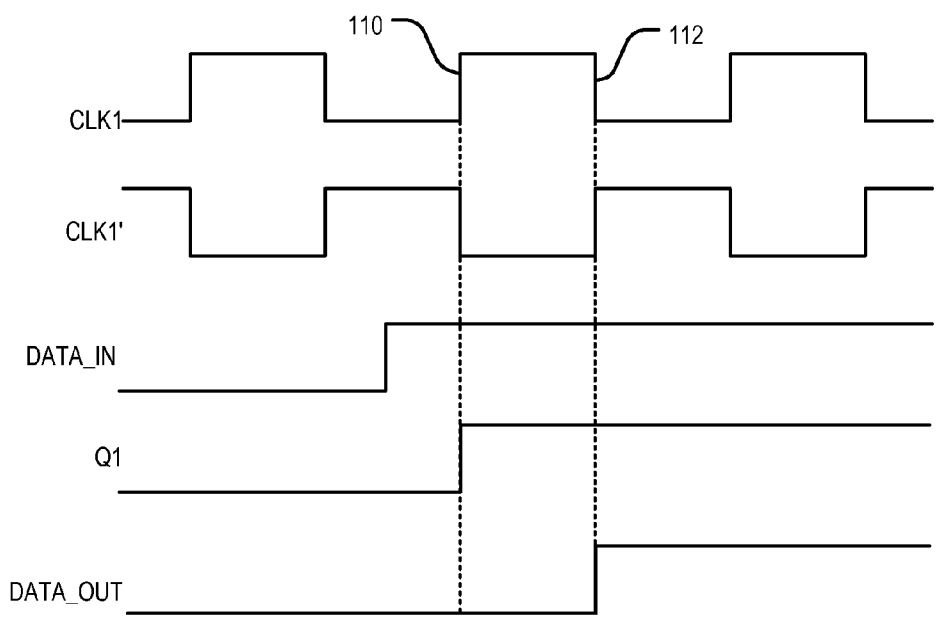
FIG. 1(b) shows a timing diagram for the master slave flip-flop circuit of FIG. 1.
Figure 2A:
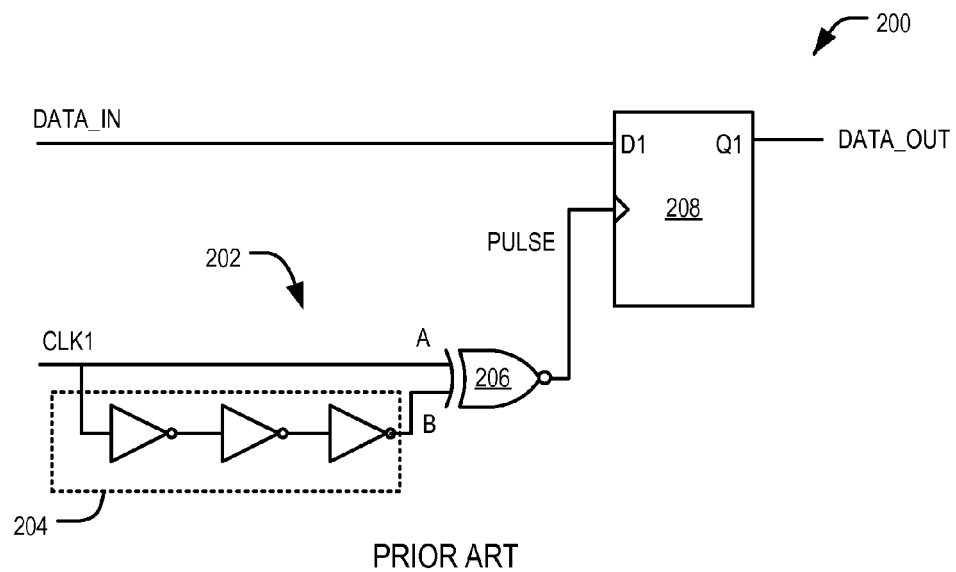
FIG. 2(a) shows a logic diagram of a conventional pulse triggered flip-flop circuit.
Figure 2B:
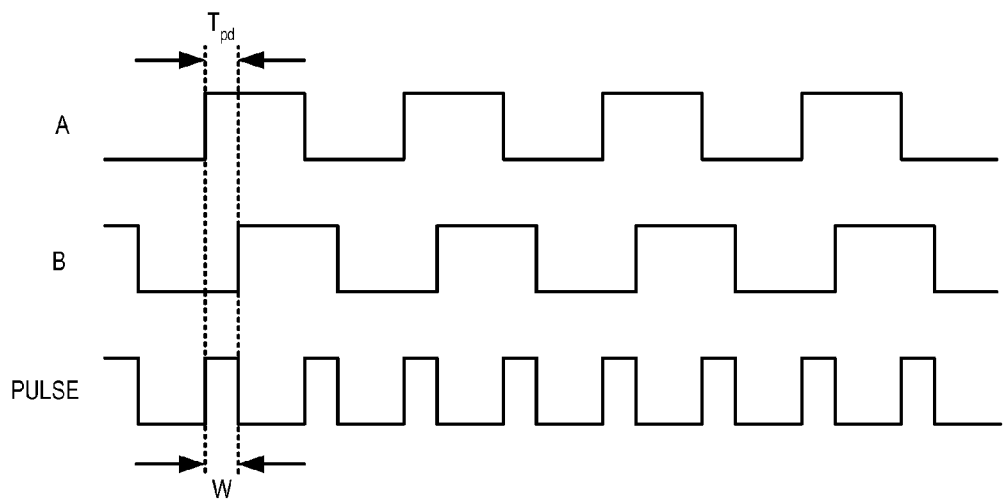
FIG. 2(b) shows a timing diagram of a pulse output signal generated by a pulse generator incorporated with the circuit pulse triggered flip-flop circuit of FIG. 2(a)

According to one aspect of the present invention, a flip-flop circuit includes: a data input; a clock input for receiving a clock signal having a plurality of active edges and inactive edges; a data output; an input circuit for setting a first node and a second node to different initial logic states in response to an inactive edge of the clock signal, and selectively changing the logic state of either the first node or the second node in response to a pulse input signal to control the state of a third node, said selection depending on the logic state of the data input signal; a pulse generator circuit for enabling the pulse input signal in response to an active edge of the clock signal, and disabling the pulse input signal in response to detecting the change in the initial logic state of either the first node or the second node; and a latch for storing a data output signal for output at the data output, the data output signal depending on the logic state of the third node.

The input circuit may include a first precharge circuit coupled to the first node, and a second precharge circuit coupled to the second node. In one embodiment, the first precharge circuit includes a transistor coupled between the first node and a first supply voltage for setting the initial logic state of the first node. The second precharge circuit includes a transistor coupled between the second node and a second supply voltage for setting the initial logic state of the second node to the logic state opposite the initial logic state of the first node.

The first supply voltage may include a positive supply voltage, and the second supply voltage may comprise a negative or ground supply voltage. In such an embodiment, the initial logic state of the second node may be a logic low state and the initial logic state of the first node may be a logic high state.

The input circuit may further include a first circuit path having a pair of transistors coupled in series between the first node and the second supply voltage, and a second circuit path comprising a pair of transistors coupled in series between the second node and the first supply voltage.

In an embodiment, the first circuit path is a pair of n-channel transistors, and the second circuit path is a pair of p-channel transistors.

The first supply voltage may include a supply voltage for setting the initial logic state of the first node to a logic high state in response to the inactive edge of the clock signal. The second supply voltage may include a supply voltage for setting the initial logic state of the second node to a logic low state in response to the inactive edge of the clock signal.

The flip flop circuit may further have comparison logic coupled to the first node and the second node for detecting when the first node and the second node have the same logic state, to detect the change in the initial logic state of the first node or the second node. In one embodiment, the comparison logic comprises an XOR gate.

In another aspect of an embodiment of the present invention a flip-flop circuit includes a data input, a clock input for receiving a clock signal having a plurality of active and inactive edges, a data output, and first and second internal nodes having different initial logic states set during an inactive period of the clock signal, the flip flop further including: a pulse generator circuit for enabling a pulse signal in response to an active edge of the clock signal, and for disabling the pulse signal in response to detecting a change in the initial logic state of either the first internal node or the second internal node; wherein the flip-flop is adapted to provide at the data output a data output signal which depends on the internal node having the changed logic state, and wherein the internal node which changes logic state during the pulse signal depends on the logic state of the data input.

Figure 3:
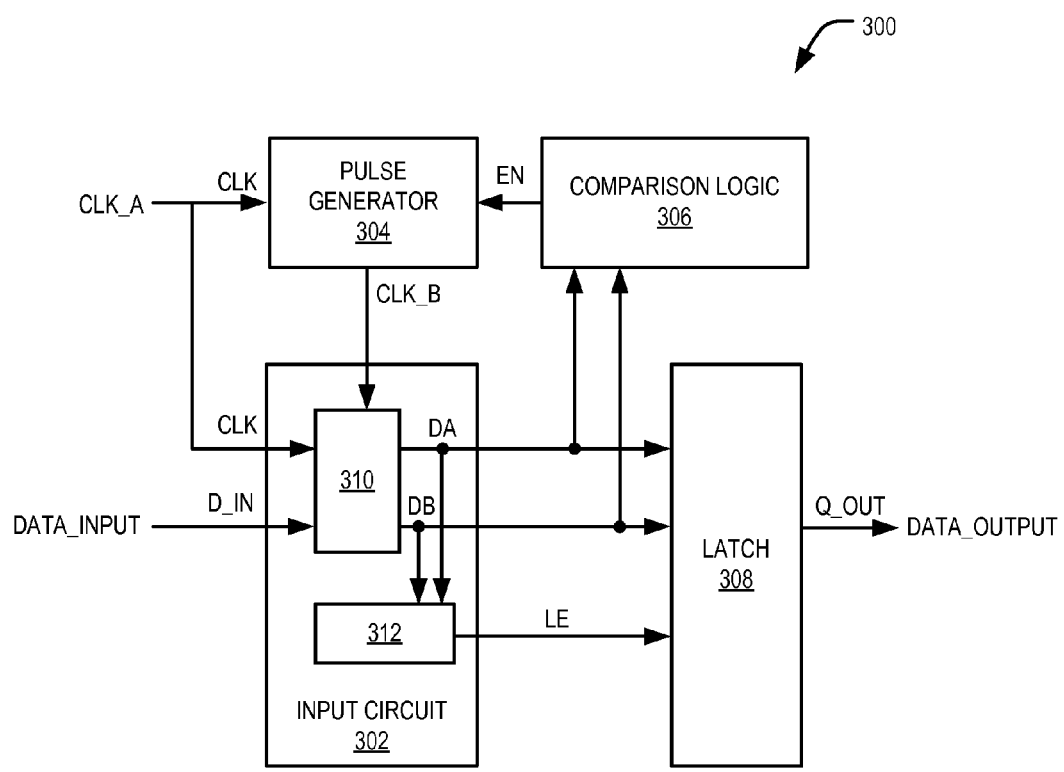
FIG. 3 shows a block diagram of a flip-flop circuit in accordance with an embodiment of the invention.

Referring now to FIG. 3 there is shown a block diagram for flip-flop circuit 300. Flip-flop circuit 300 comprises input circuit 302, pulse generator 304, comparison logic 306, latch 308, data input (D_IN), data output (Q_OUT), and clock input (CLK).

Input circuit 302 receives a data input signal DATA_INPUT through data input D_IN and a clock signal CLK_A through clock input CLK. Pulse generator 304 also receives the clock signal (CLK_A), and an enable control signal EN from comparison logic 306.

Comparison logic 306 controls enable control signal EN depending on the logic state of nodes DA, DB. Comparison logic 306 may include a logic gate, such as an XOR gate, which enables enable control signal EN when nodes DA, DB have a different logic state, and disables control signal EN when nodes DA, DB have the same logic state. It will be appreciated that comparison logic 306 has been illustrated separately to assist with the explanation of the operation of the flip-flop 300. Comparison logic 306 may be combined with the pulse generator 304 as a single logic stage implementing a suitable Boolean equation.

Input circuit 302 includes switching logic 310 for controlling the logic state of nodes DA, DB based on clock signal CLK_A, data input signal DATA_INPUT, and pulse generator output signal CLK_B. In particular, input circuit 302 "precharges" nodes DA, DB to opposite precharge logic states when clock signal CLK_A is in an inactive state (typically, "logic 0") and changes the logic state of either node D1 or node DB in response to the pulse signal CLK_B, depending on the logic state of the data input signal DATA_INPUT. Input circuit 302 also includes control logic 312 for providing a latch enable output LE for enabling latch 308 to store an output DATA_OUTPUT at output terminal Q_OUT in response to, and depending on, the logic state of nodes DA, DB.

In this respect, in this specification, references to the term "precharged" are to be understood to denote a reference to an initial predetermined logic state established during the inactive state of clock signal CLK_A, and thus prior to the arrival of the active edge of clock signal CLK_A. The active edge may include a rising edge or falling edge of clock signal CLK_A depending on the configuration of flip-flop 300.

The predetermined logic state may comprise either a "logic high" or "logic low" state. Precharging nodes DA, DB to different initial logic states may cause node DA to hold a logic high state and node DB to hold a logic low state. Precharging nodes DA, DB to different initial logic states prior to the arrival of the active edge of the clock signal CLK_A eliminates the setup time requirement.

Pulse generator 304 generates a pulse signal CLK_B in response to the active edge of clock signal CLK_A when enable control signal EN is asserted high (that is, logic 1"). In other words, the pulse generator 304 generates a pulse signal CLK_B which depends on the clock signal CLK_A and the logic state of nodes DA, DB. The dependency on the logic state of nodes DA, DB arises since comparison logic 306 controls enable control signal EN depending on the logic state of nodes DA, DB. As shown in FIG. 3, the pulse signal CLK_B is coupled to input circuit 302.

In response to the pulse signal CLK_B, input circuit 302 selectively "discharges" either node DA or node DB depending on the logic state of the data input signal DATA_INPUT to thereby change the logic state of the "discharged" node, whilst maintaining the other node at the "precharge" logic state.

In the present case, input circuit 302 provides a first circuit path which is selectively enabled to discharge node DA in response to the pulse signal CLK_B being generated, when the data input signal DATA_INPUT is low, and a second circuit path which is selectively enabled to discharge node DB in response to the pulse signal CLK_B being generated, when the data input signal DATA_INPUT is high. Because each circuit path is enabled in response to different data input signal DATA_INPUT logic states, only one of the circuit paths is enabled when the pulse signal CLK_B is generated. The circuit path, and thus the node DA or DB which is discharged, thus depends on the logic state of data input signal DATA_INPUT when the pulse signal CLK_B is generated.

In an embodiment, the node DA or DB to be discharged comprises the node DA or DB having a "precharge" logic state opposite to (in other words, the inverse of) the logic state of data input signal DATA_INPUT. In this way, the discharged node DA or DB is set to the logic state of the data input signal DATA_INPUT upon discharge.

Discharging node DA or DB may thus be performed by momentarily enabling the respective circuit path coupled between a respective node DA or DB and a respective supply voltage rail for setting the node DA or DB to the logic state opposite the precharge state. The enabled circuit path may comprise either a circuit path that "pulls up" or a circuit path that "pulls down" the selected node DA or DB depending on the respective precharge state. In other words, each node DA, DB is separately coupled to a respective circuit path, one of which is selectively enabled by the data input signal DATA_INPUT, when the pulse signal CLK_B is generated, to change the logic state of the node DA or DB from the precharge state to the logic state of data input signal DATA_INPUT.

Changing the logic state of one of the nodes DA, DB causes comparison logic 306 to disable enable control signal EN (that is, EN=0). In other words, comparison logic 306 disables the enable control signal on detecting the change in the logic state of one of the nodes DA, DB. When enable control signal EN is disabled, pulse generator 304 deactivates pulse signal CLK_B which disables the circuit path enabled by the data input signal DATA_INPUT. Input circuit 302, and more specifically control logic 312, then controls the latch enable signal LE depending on the change in the logic state of one of the nodes DA, DB to cause the latch 308 to latch an output signal DATA_OUTPUT corresponding with the data input signal DATA_INPUT.

Input circuit 302 then repeats "precharging" of data outputs DA, DB to opposite predetermined logic states when the clock signal CLK_A returns to the inactive state, which in this example is a logic low state.

The pulse generator 304 thus generates a pulse signal CLK_B having a pulse width (W) depending on the time difference between the arrival of the active edge of the clock signal CLK_A and the "discharge" of one of nodes DA or DB after the arrival of the active edge of the clock signal.

The "discharge" of one of the nodes DA, DB in response to pulse signal CLK_B also causes the data input signal DATA_INPUT appearing at the data input D_IN to propagate to data output Q_OUT of latch 308.

It is to be noted that after discharge of one of the nodes DA, DB, input circuit 302 ignores changes to the data input signal DATA_INPUT appearing at the data input D_IN until the arrival of the next active edge of the clock input CLK_A. Hence, when the pulse signal CLK_B is active, changes to the data input signal DATA_INPUT during clock signal CLK_A do not affect the logic state of nodes DA, DB and thus do not propagate to data output Q_OUT of latch 308. Hence, flip-flop 300 reliably latches data input signal DATA_INPUT independently of pulse width variations which may arise due to PVT variations.

Further, because flip-flop 300 ignores changes to the data input signal DATA_INPUT until the next active edge of the clock signal CLK_A, flip-flop 300 is not susceptible to metastability conditions caused by the data input signal DATA_INPUT changing simultaneously with or after the active edge of the clock signal CLK_A.

Figure 4:
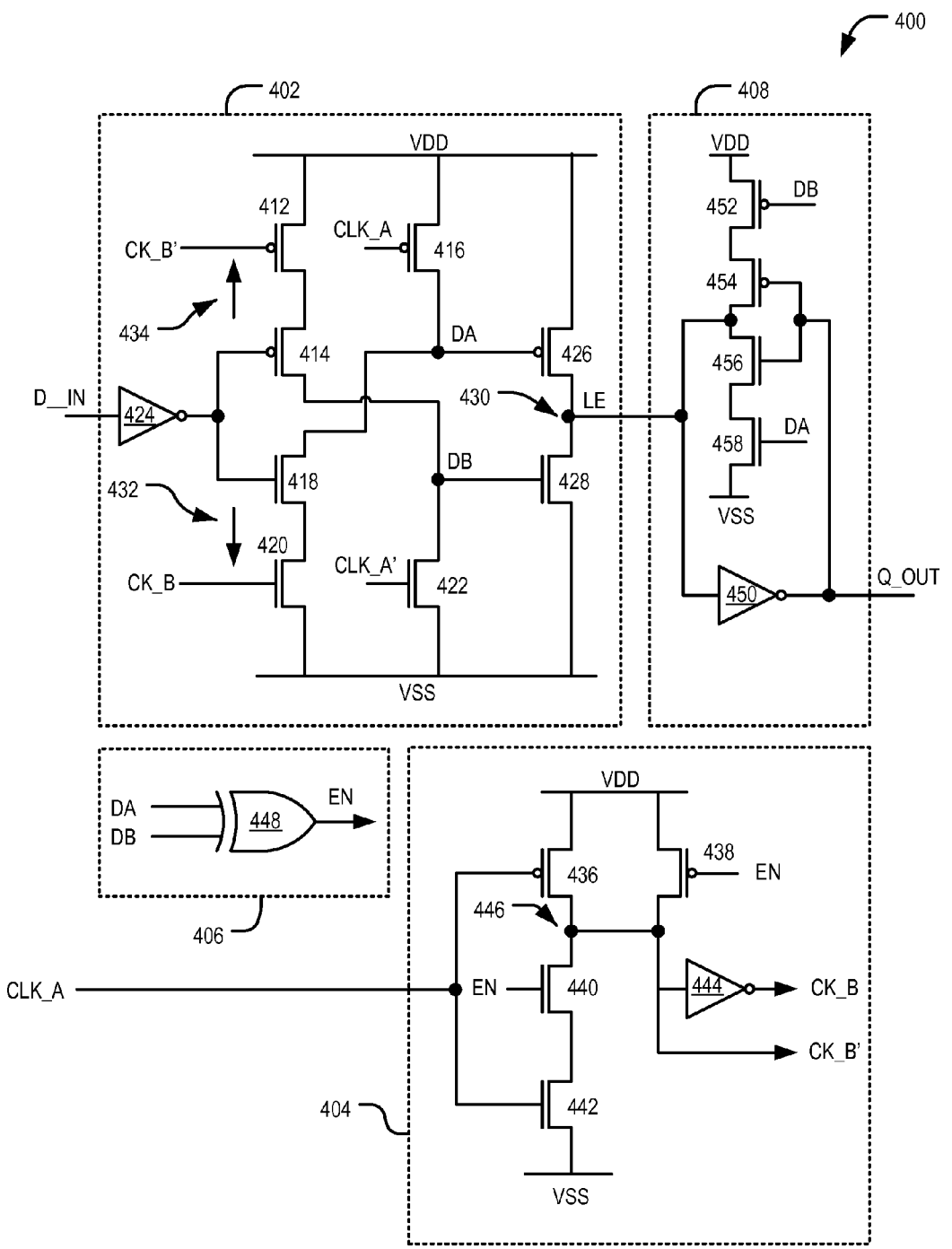
FIG. 4 shows a circuit diagram of a flip-flop circuit in accordance with an embodiment of the invention.

FIG. 4 is a schematic diagram of a flip-flop 400 according to an embodiment of the present invention. FIG. 5(a) to FIG. 5(d) are timing diagrams of signals associated with the operation of the flip-flop 400.

Referring now to FIG. 4, flip-flop 400 comprises an input circuit 402, pulse generator 404, comparison logic 406, latch 408, data input D_IN, data output Q_OUT, and clock input CLK_A. Input circuit 402 receives a data input signal through data input D_IN and a clock signal through clock input CLK_A. Flip-flop circuit 400 is suitable for use in a wide variety of digital devices.

Flip-flop circuit 400 is typically implemented as a part of an integrated circuit or module that contains other digital logic to achieve a desired logic design. Such an integrated circuit itself typically comprises one of multiple such modules of an electronic device.

Flip-flop circuit 400 may be implemented using CMOS technology, such as, 90 nm CMOS technology utilising PMOS transistors having a width to length (W/L) variation from 0.7/0.1 to 0.36/0.1, and NMOS transistors having a width to length variation of about 0.3/0.1.

Input circuit 402 includes p-channel transistors 412, 414, 416, 426, n-channel transistors 418, 420, 422, 428. and inverter 424.

Transistors 416, 422 form precharging transistors arranged to precharge nodes DA and DB respectively during the precharge period to respective different initial logic states. In this example the precharge period is when clock input CLK_A is inactive (that is, logic low). However, in other embodiments the precharge period may be defined when clock input CLK_A is active (that is, logic high).

Transistor 416 is coupled between supply voltage VDD and node DA, and transistor 422 is coupled between supply voltage VSS and node DB. In the present case, since 90 nm CMOS technology is used, supply voltage VDD is about 12 VDC and supply voltage VSS is 0V (GND).

Since the gate of p-channel transistor 416 is coupled to clock input CLK_A, and thus is turned on when clock input CLK_A is low, transistor 416 pulls node DA logic high during the precharge period. On the other hand, since the gate of n-channel transistor 422 is connected to inverted clock input CLK_A', and thus is turned on when inverted clock input CLK_A' is high (and thus when CLK_A is low), transistor 422 pulls node DB logic low during the precharge period. Nodes DA and DB are also coupled to the gate of p-channel transistor 426 and n-channel transistor 428 respectively. P-channel transistor 426 is coupled between supply voltage VDD and node 430. N-channel transistor 428 is coupled between node 430 and supply voltage VSS. Node 430 provides a latch enable signal LE as an input to latch 408. Node 430 has a logic state which depends on the logic state of nodes DA, DB, as will be explained in more detail below.

Transistors 418, 420 are coupled in series between node DA and supply voltage VSS to provide a first circuit path 432. Since the gates of p-channel transistors 418, 420 receive inverted data input D_IN (via the output of inverter 424) and pulse signal CK_B respectively, the first circuit path 432 is controlled by, and thus depends on, data input D_IN and pulse signal CK_B. In this example, the first circuit path 432 is enabled when data input D_IN is logic low and pulse signal CK_B is logic high, and disabled when either data input D_IN is logic high or pulse signal CK_B is logic low.

Transistors 412, 414 are coupled in series between node DB and supply voltage VDD to provide a second circuit path 434. Since the gates of transistors 412 and 414 receive the inverted pulse signal CK_B' and inverted data input D_IN (via the output of inverter 424) respectively, the second circuit path 434 is controlled by, and thus depends on, data input D_IN and inverted pulse signal CK_B'. In this example, the second circuit path 434 is enabled when data input D_IN is logic high and inverted pulse signal CK_B' is logic low, and disabled when either data input D_IN is logic low or inverted pulse signal input CK_B' is logic high.

Pulse generator 404 comprises p-channel transistors 436, 438, n-channel transistors 440, 442, and inverter 444. The gate terminal of each transistor 436, 442 receives clock input CLK_A.

The gate terminal of each transistor 438, 440 is coupled to the output of comparison logic 406 to receive enable signal EN. Transistors 436, 438 are coupled in parallel between supply voltage VDD and node 446. Node 446 is an output node of pulse generator 404 for providing inverted pulse signal CK_B' to the gate terminal of p-channel transistor 412 and to the input of inverter 444.

Transistors 440, 442 are coupled in series between node 446 and supply voltage VSS. Input of inverter 444 is connected to node 446 and provides pulse signal CK_B at an output for input to the gate terminal of n-channel transistor 420.

Comparison logic 406 comprises a two-input XOR gate 448. The inputs of the XOR gate 448 are coupled to nodes DA, DB respectively. The XOR gate 448 output is coupled to the gates of transistors 440, 438 of the pulse generator 404 as previously explained to provide the enable signal EN thereto.

Latch 408 comprises inverter 450, p-channel transistors 452, 454, and n-channel transistors 456, 458. Latch 408 provides at data output Q_OUT an output signal responsive to the logic state of node 430 and nodes DA, DB. Operation of latch 408 would be understood by a skilled addressee.

With reference now to FIG. 4 and FIG. 5(*a*), in operation, during a precharge period of flip-flop 400, which in the present case is when the clock input CLK_A is in an inactive state (and thus CLK_A' is in an active state), transistors 416 and 422 are turned on to precharge node DA logic high (that is, "1") and node DB logic low (that is, "0") respectively.

When nodes DA and DB are precharged logic high and logic low respectively, the enable signal EN at the output of the XOR gate 448 is held logic high, which holds n-channel transistor 440 on and p-channel transistor 438 off. In this condition, and whilst the clock input CLK_A remains in the inactive state, which in this example is a logic high state, n-channel transistor 436 will be on, and thus inverted pulse signal CK_B' is pulled or held logic high by n-channel transistor 436, and thus pulse signal CK_B is pulled or held logic low.

When nodes DA and DB are precharged logic high and logic low respectively, p-channel transistor 426 and n-channel transistor 428 are turned off and thus do not control the logic state of node 430. Furthermore, since the gate terminal of p-channel transistor 452 is coupled to node DB, and the gate terminal of n-channel transistor 458 is coupled to node DA, p-channel transistor 452 and n-channel transistor 458 are turned on when nodes DA and DB are precharged logic high and logic low respectively.

Transistors 452, 454, 456, and 458 are arranged in a feedback path coupled between the output and the input of inverter 450. During the precharge period, the feedback path is configured such that latch 408 stores the data output Q_OUT as the data input D_IN latched in response to the previous active edge of clock input CLK_A. During the precharge period, and thus when p-channel transistor 452 and n-channel transistor 458 are both on, if data output Q_OUT is logic low, p-channel transistor 454 will drive node 430 logic high through the action of transistor 452 and thus cause inverter 450 to hold data output Q_OUT logic high. On the other hand, if data output Q_OUT is logic high, n-channel transistor 456 will drive node 430 logic low through the action of transistor 458 and cause inverter 450 to hold data output Q_OUT logic low.

In response to the active edge of clock input CLK_A, shown in FIG. 5(*a*) as a rising edge, precharge transistors 416, 422 are both turned off thus decoupling nodes DA, DB from the respective supply voltages VDD, VSS. Further, transistor 436 turns off and p-channel transistor 442 turns on. In this condition, node 446, and thus inverted pulse signal CK_B', transitions to a logic low state through p-channel transistor 440 and 442, and thus pulse signal CK_B transitions to a logic high state, as shown in FIG. 5(*a*).

When inverted pulse signal CK_B' transitions to a logic low state, transistor 412 turns on. When pulse signal CK_B transitions to a logic high state, transistor 420 turns on. After transistors 412 and 420 are turned on, p-channel transistor 414 will effectively be coupled between supply voltage VDD and node DB, whilst n-channel transistor 418 will effectively be coupled between supply voltage VSS and node DA.

While transistors 412 and 420 are turned on, if data input D_IN is at a logic low state, transistor 418 will be on, thus enabling the first circuit path 432 and thereby pulling node DA to a logic low state through n-channel transistors 418 and 420, and thereby changing the logic state of node DA from its precharge logic state (that is, "1") to a logic low state (that is, "0"). Because node DA is precharged logic high prior to the arrival of the active edge of clock input CLK_A, there is substantially no delay required to transition node DA to logic low state from the precharge state.

Since transistors 414 and 422 are turned off, node DB will be weakly held to maintain its precharged logic state (that is, "0"). Hence, node DA and DB will have the same logic state, which is a logic low state Because node DB is weakly held in a logic low state, transistor 428 remains off. However, when node DA transitions to a logic low state, transistor 426 turns on, and thus node 430 either transitions to, or maintains, a logic high state through transistor 426, causing a logic low state to appear at the output of inverter 450 as a logic low data output Q_OUT.

Further, when the output Q_OUT of inverter 450 is logic low, and nodes DA and DB are logic low, transistors 452, 454 are turned on, whilst transistor 458 is turned off, thereby providing a feedback path which causes latch 408 to hold the logic low data output Q_OUT.

The above example relates to the condition in which the data input D_IN is at a logic low state whilst 412 and 420 are turned on. If data input D_IN is at a logic high state whilst 412 and 420 are turned on, transistor 414 will be on (and transistor 418 will be off) thus enabling the second circuit path 434 and thereby pulling node DB to a logic high state through p-channel transistors 412 and 414, thereby changing the logic state of node DB from its precharge logic state (that is, "0") to a logic high state (that is, "1").

However, since transistors 416 and 418 are off, node DA will be weakly held and maintain its precharge logic state (that is "1"). Hence, node DA and DB will have the same logic state, which is a logic high state. Because node DB is precharged logic low prior to the arrival of the active edge of the clock input CLK, there is substantially no delay required to transition node DB to logic high state from the precharged state.

Because node DA is weakly held in a logic high state, transistor 426 is turned off. However, when node DB transitions to a logic high state, transistor 428 turns on and node 430 either transitions to, or maintains, a logic low state through transistor 428, causing a logic high state to appear at the output of inverter 450 as a logic high data output Q_OUT.

Further, when the output of inverter 450 is logic high, and nodes DA and DB are logic high, transistors 456, 458 are turned on, whilst transistor 452 is turned off, thereby providing a feedback path which causes latch 408 to hold the logic high data output Q_OUT.

In view of the above, in response to an active edge of the clock input CLK_A, either node DA or DB will change logic state depending on the data input D_IN such that nodes DA and DB have the same logic state. If the data input D_IN is logic high, node DB will transition from a logic low precharge state to a logic high state, whereas if the data input D_IN is logic low, node DA will transition from a logic high precharge state to a logic low state.

When nodes DA and DB have the same logic state, which will occur whenever either of DA or DB change state from their initial precharge state, comparison logic 406 disables enable control signal EN (that is, EN=0). When the enable control signal EN is disabled, n-channel transistor 438 turns on and p-channel transistor 440 turns off. Because transistor 438 is coupled between supply voltage VDD and pulse signal CK_B, when transistor 438 turns on node 446 is driven to a logic high state. The transition of node 446 to logic high, drives inverted pulse signal CK_B' high and pulse signal CK_B low, which in turn causes transistors 412, 420 to turn off. When transistors 412, 420 turn off, transistors 414 and 418 are decoupled from the respective supply voltages VDD, VSS. In this configuration, nodes DA and DB, and thus node 430, are not affected by further changes to data input D_IN.

Figure 5A:
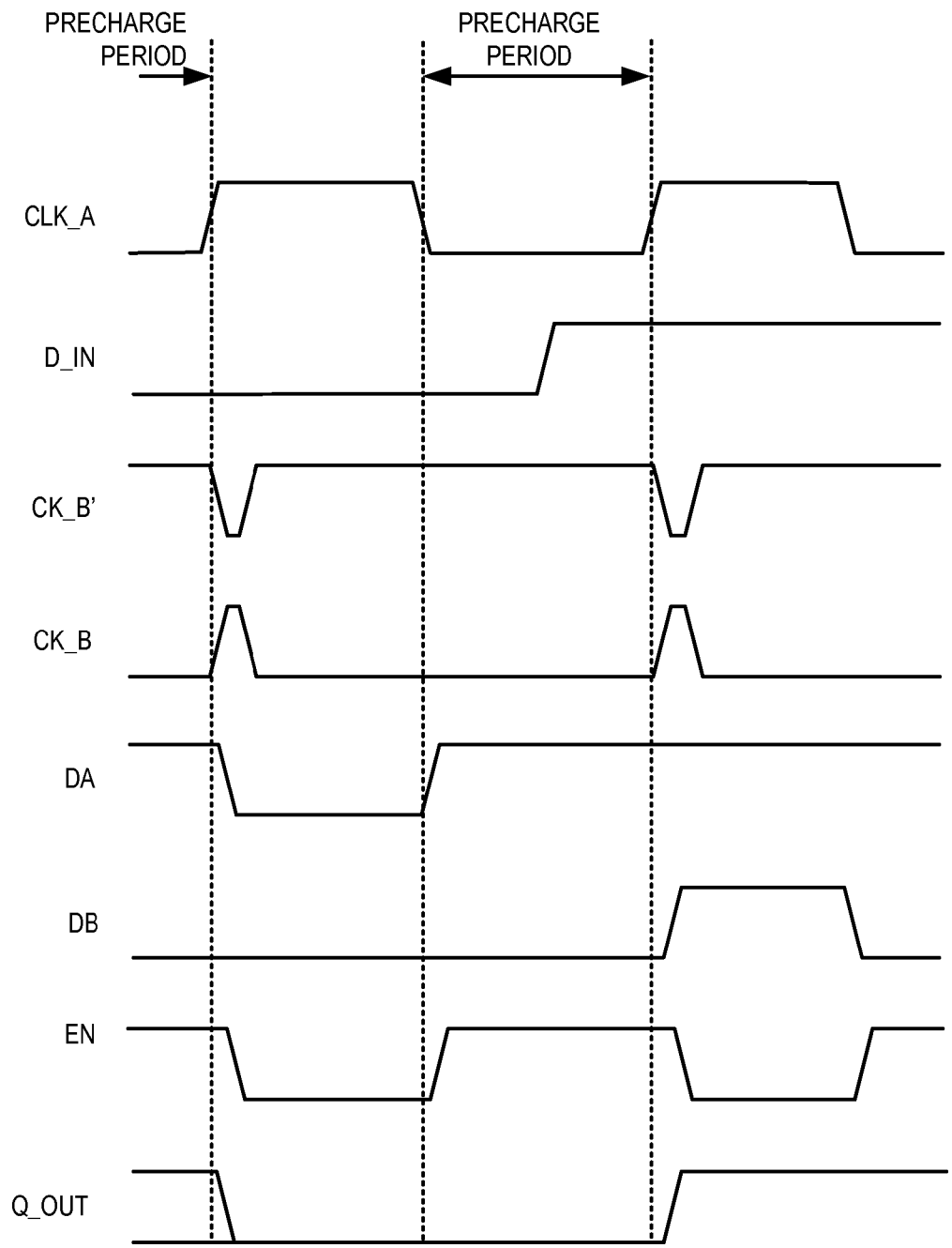
FIGS. 5(a) to 5(d) show timing diagrams for the circuit of FIG. 4.
Figure 5B:
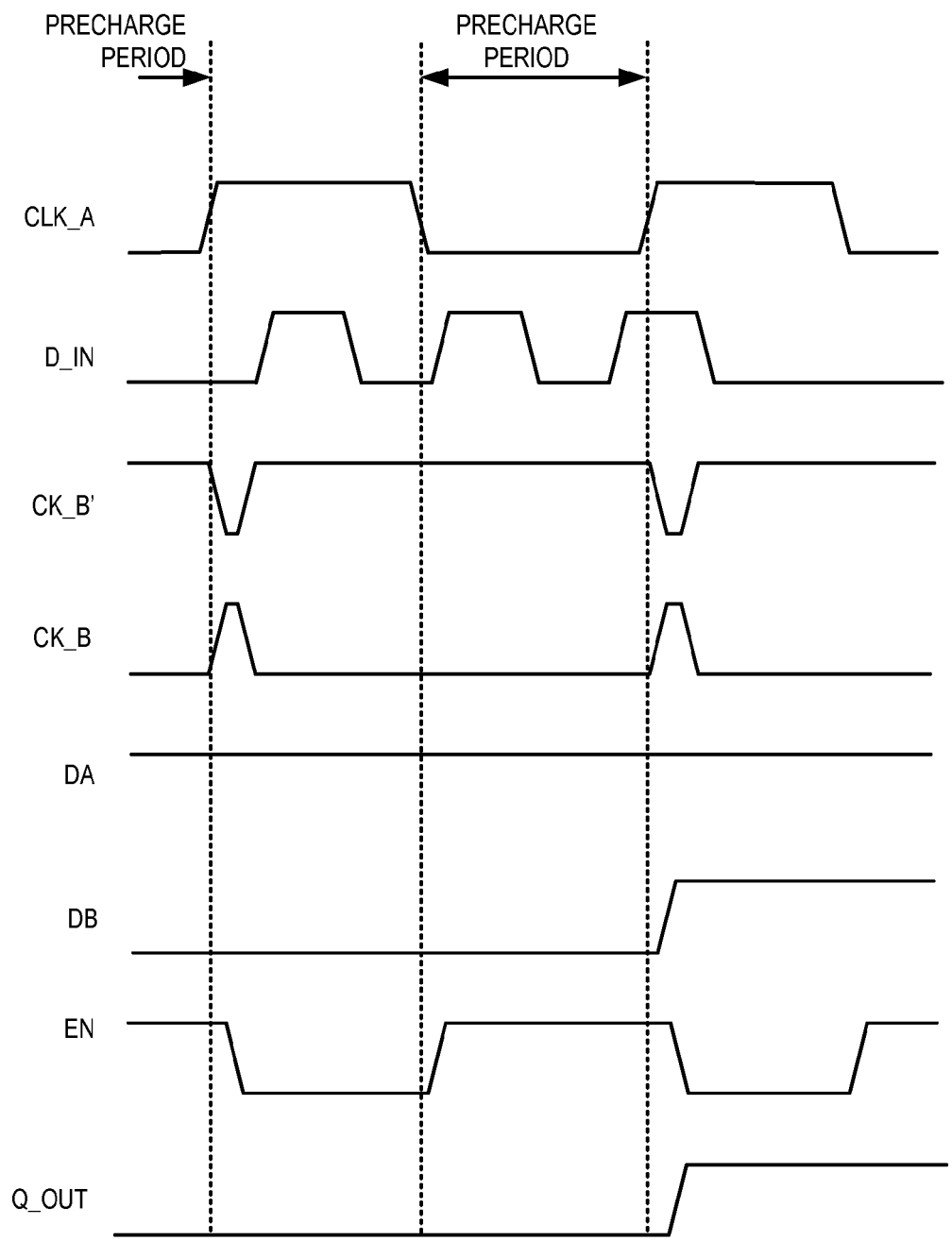
Figure 5C:
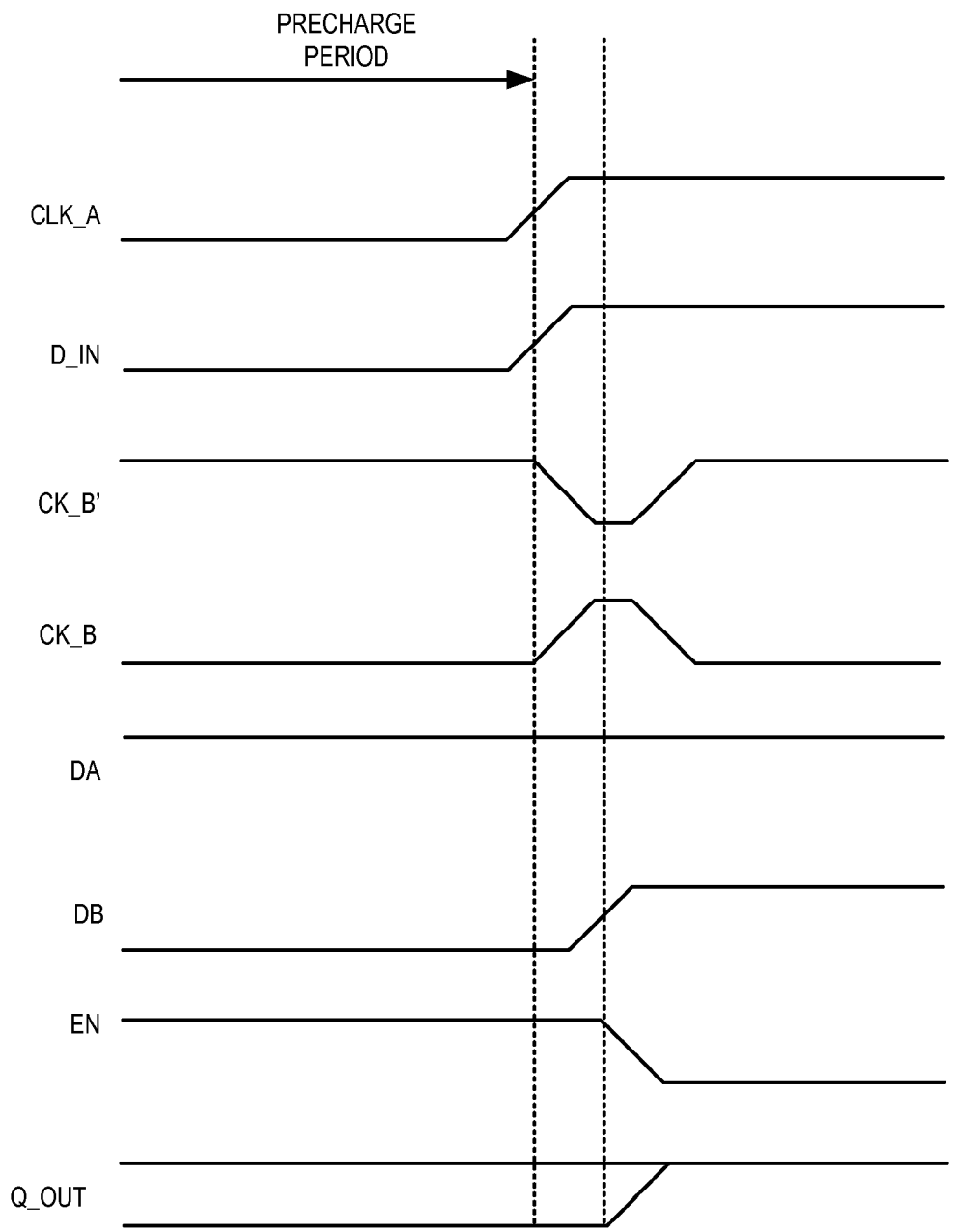
Figure 5D:
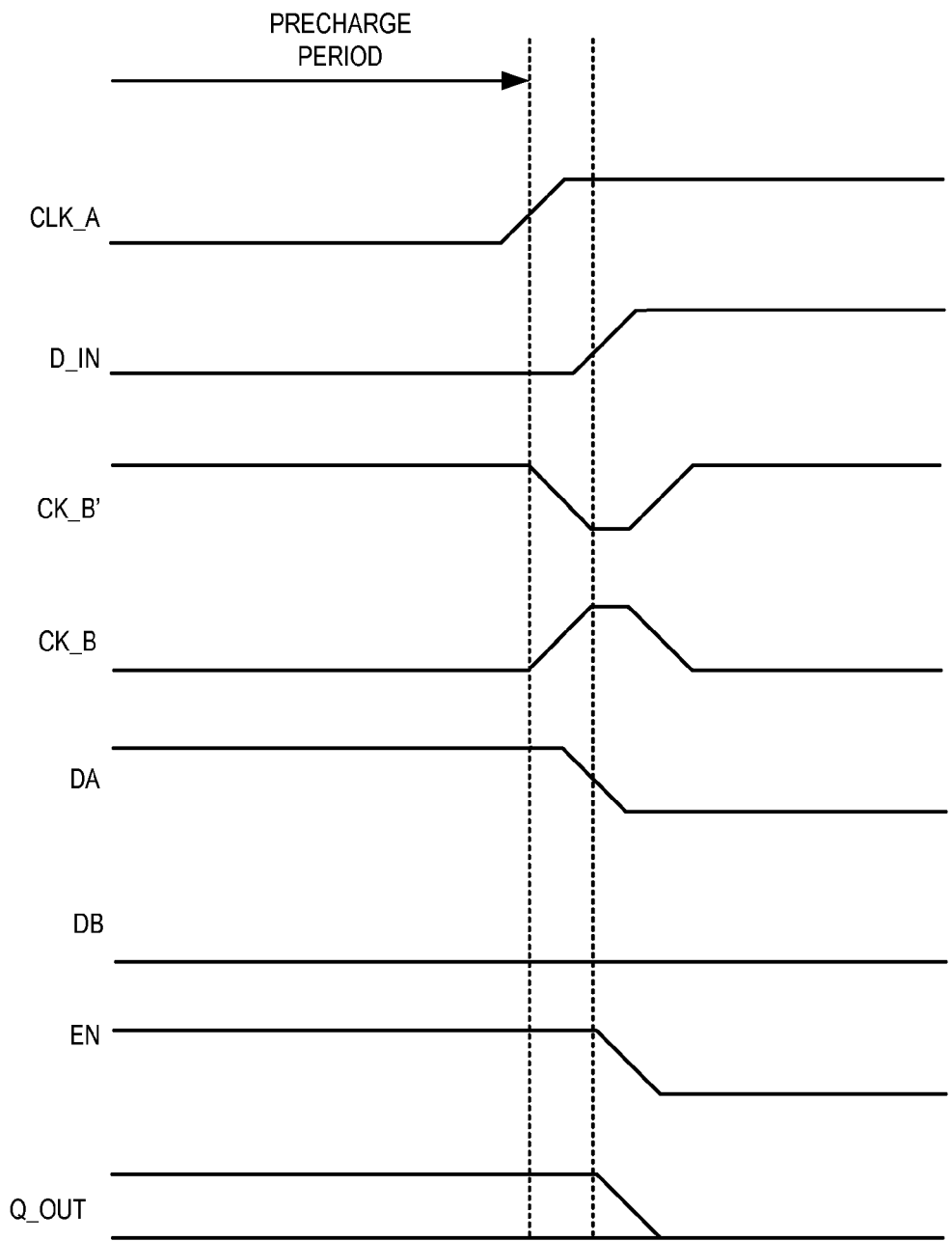

FIG. 5(b) to FIG. 5(d) are timing diagrams illustrating the operation of flip-flop 400 for different timing relationships between data input D_IN and clock input CLK_A.

As shown in FIG. 5(b), during the active period of clock signal CLK_A, which in this example is when the clock input CLK_A is logic high, logic state transitions on data input D_IN after the pulse signal CK_B and inverted pulse signal CK_B' do not affect the logic state of nodes DA or DB since transistors 412 and 420 will be turned off, thus disabling the second path 434 and the first circuit path 432 respectively. Hence, data input D_IN is not passed to data output Q_OUT. Similarly, during the inactive period of clock signal CLK_A, which in this case is when the clock input CLK_A is logic low, logic state transitions on data input D_IN do not affect the logic state of nodes DA or DB since transistors 412 and 420 will remain turned off. Hence, under this condition also the signal at data input D_IN is not passed to data output Q_OUT.

In response to the active edge of clock input CLK_A, which in this example is a rising edge, the signal (that is, the logic state) at data input D_IN will be passed to data output Q_OUT as described above.

FIG. 5(c) is a timing diagram for an input condition in which the data input D_IN transitions from a logic low state to a logic high state substantially synchronously with the active edge of clock input CLK_A. In this condition, either the first circuit path 432 or the second circuit path 434 will be selectively enabled in response to the pulse input signal CK_B and the inverted pulse signal CK_B', with the selection depending on the logic state of the data input signal. In this example, since data input D_IN is logic high when pulse signal CK_B is enabled, the second circuit path 434 is enabled to pull node DB logic high, and thus set node 430 logic low without any metastability.

FIG. 5(d) shows a timing diagram for an input condition in which the data input D_IN transitions from a logic low state to a logic high state during the pulse signal CK_B. Again, in this condition, either the first circuit path 432 or the second circuit path 434 will be selectively enabled in response to the pulse input signal CK_B and the inverted pulse signal CK_B', with the selection depending on the logic state of the data input signal.

A flip-flop according to embodiments of the present invention may provide an improved performance both in terms of reduced set up and hold time requirements, and stability.

Furthermore, it is envisaged that embodiments of the invention may require reduced power and less surface area compared to conventional master-slave devices.

It will be apparent to those skilled in the art that the present invention contemplates a high performance flip-flop circuit. It is understood that the form of the invention shown and described in the detailed description and the drawings are to be taken merely as presently preferred examples. It is intended that the following claims be interpreted broadly to embrace all the variations of the preferred embodiments disclosed.

The invention claimed is:

1. A flip-flop circuit, comprising:
   a data input;
   a clock input for receiving a clock signal having a plurality of active edges and inactive edges;
   a data output;
   an input circuit for setting a first node and a second node to different initial logic states in response to an inactive edge of the clock signal, and selectively changing the logic state of either the first node or the second node in response to a pulse input signal to control the state of a third node, said selection depending on the logic state of the data input,
   wherein the input circuit includes,
      a first precharge circuit comprising a first transistor coupled between the first node and a first supply voltage for setting the initial logic state of the first node,
      a second precharge circuit comprising a second transistor coupled between the second node and a second supply voltage for setting the initial logic state of the second node to the logic state opposite the initial logic state of the first node,
      a first circuit path comprising a first pair of transistors coupled in series between the first node and the second supply voltage, and
      a second circuit path comprising a second pair of transistors coupled in series between the second node and the first supply voltage;
   a pulse generator circuit for enabling the pulse input signal in response to an active edge of the clock signal, and disabling the pulse input signal in response to detecting the change in the initial logic state of either the first node or the second node; and
   a latch for storing a data output signal for output at the data output, the data output signal depending on the logic state of the third node.

2. The flip-flop circuit of claim 1, wherein the first supply voltage is a positive supply voltage and the second supply voltage is a negative or ground supply voltage.

3. The flip-flop circuit of claim 1, wherein the first supply voltage sets the initial logic state of the first node to a logic high state in response to the inactive edge of the clock signal, and the second supply voltage sets the initial logic state of the second node to a logic low state in response to the inactive edge of the clock signal.

4. The flip-flop circuit of claim 3, wherein the first pair of transistors comprises a pair of n-channel transistors and the second pair of transistors comprises a pair of p-channel transistors.

5. The flip flop circuit of claim 1, further comprising comparison logic coupled to the first and second nodes for detecting when the first and second nodes have the same logic state, to thereby detect the change in the initial logic state of one of the first and second nodes.

6. The flip flop circuit of claim 5, wherein the comparison logic comprises an XOR gate.

* * * * *